United States Patent [19]
Iwayanagi et al.

[11] Patent Number: 4,835,089
[45] Date of Patent: May 30, 1989

[54] RESIST PATTERN FORMING PROCESS WITH DRY ETCHING

[75] Inventors: Takao Iwayanagi, Nerima; Norio Hasegawa, Nishitama; Toshihiko Tanaka, Setagaya; Hiroshi Shiraishi; Takumi Ueno, both of Hachioji; Michiaki Hashimoto, Yono; Seiichiro Shirai, Higashikurume; Kazuya Kadota, Nishitama, all of Japan

[73] Assignee: Hitachi, Ltd., Tokyo, Japan

[21] Appl. No.: 60,323

[22] Filed: Jun. 10, 1987

[51] Int. Cl.⁴ .............................. G03F 7/26
[52] U.S. Cl. .................. 430/323; 430/167; 430/194; 430/197; 430/311; 430/316; 430/317; 430/318; 430/322; 430/325; 430/326; 430/327; 430/330
[58] Field of Search ........... 430/323, 325, 324, 313, 430/314, 316, 312, 327, 330, 197, 194, 167, 317, 318, 311, 322, 326

[56] References Cited

U.S. PATENT DOCUMENTS

| | | | |
|---|---|---|---|
| 2,852,379 | 9/1958 | Hepher et al. | 430/197 |
| 2,937,085 | 5/1960 | Seven et al. | 430/167 |
| 3,873,313 | 3/1975 | Horst | 430/166 |
| 4,125,650 | 11/1978 | Chiu et al. | 430/191 |
| 4,407,850 | 10/1983 | Bruce | 430/313 |
| 4,427,713 | 1/1984 | White et al. | 430/330 |
| 4,469,778 | 9/1984 | Iwayanagi et al. | 430/325 |
| 4,532,005 | 7/1985 | Grieco et al. | 430/312 |
| 4,551,409 | 11/1985 | Gulla et al. | 430/192 |
| 4,554,237 | 11/1985 | Kataoka et al. | 430/194 |
| 4,590,149 | 5/1986 | Nakane et al. | 430/325 |
| 4,631,249 | 12/1986 | Kalyanaraman | 430/312 |

OTHER PUBLICATIONS

Kaplan, L. H. et al., IBM Technical Disclosure Bulletin, vol. 15, No. 7, 12/1972, pp. 2339–2340.
Thompson, L. F. et al., *Introduction to Microlithography*, ACS Symposium Series #219, pp. 112–117, 1983.
Thompson, L. F. et al., *Materials for Microlithography*, ACS Symposium Series #266, pp. 48–53, 1984.
Iwayanagi, T. et al., J. Electro Chem. Soc.: Solid State Science and Technology, vol. 134, No. 4, pp. 963–967, 4/1987.

*Primary Examiner*—Charles L. Bowers, Jr.
*Attorney, Agent, or Firm*—Antonelli, Terry & Wands

[57] ABSTRACT

A thick polymer film containing an aromatic bisazide and/or an aromatic sulfonyl azide compound is formed on a substrate having topography level on its surface to flatten said surface and then heated or the whole surface thereof is exposed to a light. A mask pattern having a dry etching resistance higher than that of the polymer is formed on the polymer film, exposed parts of the polymer film are removed by the dry etching and the exposed parts of the film to be processed are removed to form a pattern.

34 Claims, 2 Drawing Sheets

RESIST PATTERN FORMING PROCESS WITH DRY ETCHING

This application is a continuation application of application Ser. No. 776,662, filed Sept. 6, 1985, now abandoned.

BACKGROUND OF THE INVENTION

The present invention relates to a pattern forming process. More particularly, the invention relates to a pattern forming process capable of giving a fine pattern with a high accuracy even when the surface of a substrate has topography (unevenness).

As the scale of a semiconductor integrated circuit and its density are being increased recently, formation of an extremely fine pattern with a high accuracy is demanded more and more eagerly.

As is well known, a process called "photolithography" is generally employed in forming fine patterns in semiconductor integrated circuits, magnetic bubble memory devices, etc. An excellent resist pattern having a line width of about 1 μm can be formed according to the photolithography when a substrate having a smooth surface and a low reflectivity is used. However, when the surface of a substrate is uneven and reflective pattern deformation occurs because of reflection of the incident light from the topographic surface of the substrate.

Further, in the latter case, a difference in the film thickness of the resist layer on the substrate occurs between the upper level part and the lower level part and, therefore, the light interference varies in the resist film to increase or decrease the pattern width, to thereby reduce the dimensional stability of the pattern. To effect the patterning in an excellent manner by solving these problems due to such unevenness of the substrate surface, there has been proposed a multi-layer resist process.

The multi-layer resist process comprises applying a thick layer of an organic substance having a high absorbance onto the whole surface of a substrate to flatten the surface, forming a thin resist pattern thereon according to a known photolithographic technique, transferring the resist pattern to said thick layer of the organic substance and etching exposed parts of the substrate. In one embodiment, the exposed parts of the above-mentioned thick organic layer are etched directly using said resist pattern as a mask. In another embodiment, a thin film (intermediate layer) made of a material having a high dry etching resistance is interposed between the thick organic substance layer and the resist pattern, unnecessary parts of the thin film are removed and then the exposed parts of said thick organic substance layer are etched using the thin film as a mask. Since the topography or unevenness of the substrate surface is eliminated by forming the layer of the organic substance having a high absorbance, a light penetrating through the photoresist film formed thereon is absorbed by the layer of the organic substance. Therefore, the phenomena of halation on the uneven part of the substrate and the light interference in the resist film in the uneven portion of the substrate due to the reflection and scattering of the light can be reduced. As a result, the deformation of the pattern can be minmized and the dimensional stability can be improved. The organic substances used usually heretofore in eliminating the topography include positive novolak resin resists and polyimide resins. To improve the absorbance of the organic substances, a process comprising a thermal treatment thereof at a temperature of 200° C. or higher or addition of a dye having a high absorbance thereto has been proposed (see the specification of Japanese Patent Laid-Open No. 172736/1982).

However, in order to absorb a light of 436 or 405 nm, which is an exposure wavelength currently employed in a reduction projection exposure process using said novolak resin positive resist as a material of bottom organic substance layer, a baking at a temperature of as high as 200° C. or above is necessary after the formation of the bottom layer. The higher the baking temperature, the higher the absorption of the light of exposure. However, as the baking temperature is elevated beyond 200° C., the surface of the bottom organic substance layer begins to be carbonized to damage the adhesion between the organic substance layer and the resist film formed thereon.

It was also reported that a novolak resin positive resin containing a light-absorptive dye was tentatively used as a material for the bottom layer. However, the baking temperature cannot be elevated beyond about 160° C., since the light-absorptive dye sublimes or decomposes at such a high temperature, as described by Michel M. O' Toole et al. in "Linewidth Control in Projection Lithography Using a Multilayer Resist Process" IEEE Electron Device, Vol. ED-28, p. 1405 (1981). Consequently, the bottom layer film is insufficiently insolubilized so that it is dissolved when the top photoresist layer is applied thereto, thus making the formation of the multi-layer structure difficult. Further, in forming an intermediate layer between the top layer and the bottom layer by applying spin-on glass (SOG) thereto, a gas is generated from the bottom layer when the intermediate SOG layer is baked to form $SiO_2$, because the baking temperature of the bottom layer was low. As a result, cracks are formed in the SOG layer to make the formation of the multilayer film difficult.

SUMMARY OF THE INVENTION

An object of the present invention is to provide a pattern forming process capable of giving a fine pattern with a quite high dimensional accuracy by overcoming the defects of the conventional multi-layer resist process.

According to the present invention, the object can be attained by incorporating an aromatic azide compound and/or an aromatic sulfonyl azide compound in the bottom organic substance layer and heating it or exposing the entire surface thereof to reduce the transmission of light used in the exposure for the pattern formation.

After investigations of various light-absorptive compounds, the inventors have found that aromatic azides are decomposed by baking or flood exposure treatment in various polymer films and that they react with the polymer to form non-volatile substances which absorb a light of a wavelength longer than that of the absorption maximum wavelength of said aromatic azide compounds. The non-volatile substances formed from the aromatic azide compound and the polymer by the heat treatment or the flood exposure treatment comprise mainly secondary amines formed by the reaction of a nitrene (formed from the azide by the thermal decomposition or photolysis) with the polymer.

The aromatic azide compounds used in the present invention are selected so that the absorption maximum wavelength thereof coincides with a wavelength of a light to which the top photoresist layer is exposed. For example, a light of a wavelength of 436 nm is usually employed in the exposure in the conventional reduction projection exposure process. In such a case, it is desirable to select an aromatic azide compound having an absorption maximum wavelength of 330 to 430 nm.

In the process of the present invention, the top resist layer is formed on the bottom organic substance layer directly or via an intermediate layer such as an SOG layer. Therefore, it is necessary to subject the polymer constituting the bottom organic substance layer to a crosslinking reaction by the baking or the flood exposure treatment to insolubilize the same in an organic solvent. For this purpose, the aromatic azide compound must be one having a bifunctional group, i.e. a bisazide compound. It is possible to use an azide compound having the characteristic light absorption properties in combination with another azide compound having an insolubilizing effect in the solvent as will be described below. For example, a monoazide compound may be used for the purpose of realizing the light absorption properties and a bisazide compound may be used in realizing the insolubilizing effect in combination with the monoazide in a suitable mixing ratio to obtain excellent results.

The inventors have further found that when aromatic sulfonyl azide compounds are baked or subjected to the flood exposure treatment in various polymer films, they are decomposed and react with the polymer to form a non-volatile matter like the above-mentioned aromatic azide compounds and that the absorption spectrum of them is substantially unaltered even after the decomposition unlike, the aromatic azide compounds.

The inventors have also found that when the aromatic sulfonyl azide compound or the aromatic azide compound is incorporated in the polymer film, not only the light absorption at 436 or 405 nm (exposure wavelength in the reduction projection exposure process) is substantially unaltered but also an increase in absorption of a light of wavelength above 500 nm such as 546 nm, used to detect an alignment mark used in the alignment in the pattern formation, is extremely small.

Thus, when the aromatic sulfonyl azide compound is incorporated in the polymer, the reflection of the light on the surface of the film to be processed can be reduced and the dimensional accuracy of the pattern can be improved without reducing the accuracy of the alignment.

As described above, in the multi-layer resist process of the present invention, the top photoresist layer is formed on the bottom organic substance layer directly or via an intermediate layer such as the above-mentioned SOG layer. Therefore, it is necessary to insolubilize the polymer constituting the bottom layer in an organic solvent by baking or the flood exposure treatment. For this purpose, the aromatic sulfonyl azide compound is preferably bifunctional, namely, it must be a bisulfonyl azide compound. It is possible to use the sulfonyl azide compound having the characteristic light absorption properties in combination with another compound having the ability of insolubilizing a polymer film in the solvent as will be described below. For example, a compound such as an aromatic azide compound capable of insolubilizing the polymer by light or heat may be used. Examples of these azide compounds include bisazide compounds such as 3,3'-diazidodiphenyl sulfone, 4,4'-diazidodiphenylmethane, 4,4'-diazidodiphenyl ether 4,4'-diazidodiphenyl sulfide, 4,4'-diazidodiphenyl disulfide, 4,4'-diazidodiphenyl sulfone and 4,4'-diazidostilbene. Thermosetting resins may be used as polymers constituting the bottom layer.

The organic materials which form the bottom layer in the multi-layer resist process of the present invention include thermosetting resins and polymers which can be hardened or insolubilized in a solvent by the thermal or photochemical treatment. Examples of them include phenolic resins such as novolak resin and polyvinylphenol; natural rubber; modified rubbers such as cyclized natural rubber; synthetic rubbers such as polybutadiene, polyisoprene, cyclized polybutadiene, cyclized polyisoprene and styrene/butadiene rubber; and synthetic polymers such as polystyrene, iodinated polystyrene, polyvinyl butyral, polymethyl methacrylate, polyglycidal methacrylate and polymethyl isopropenyl ketone.

A baking temperature of 100° to 300° C., particularly 140° to 250° C., is preferred in the insolubilization treatment conducted by reacting the aromatic sulfonyl azide or aromatic azide compound contained in the bottom organic substance layer with the polymer constituting the bottom layer. The light used in the flood exposure treatment may be any one having a wavelength in the range of 200 to 500 nm. Under these conditions, the above-mentioned insolubilization reaction proceeds sufficiently.

The aromatic sulfonyl azide compounds used as the organic substance which forms the bottom layer in the present invention may be obtained easily from aromatic sulfonic acids or their salts by converting them into acid chlorides and treating the same with sodium azide or the like. Many of acid dyes and direct dyes which are soluble in water are aromatic sulfonic acid derivatives. These dyes have various color tones. Therefore, a suitable sulfonyl azide absorbent for the bottom layer can be selected from the group consisting of these dyes depending on the wavelength of the light to which the top photoresist layer is to be exposed and also that of the light used in detecting an alignment mark according to the present invention.

DETAILED DESCRIPTION OF THE PREFERRED EMBODIMENTS

Example 1

Figure 1A:
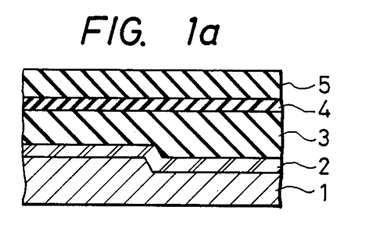
FIGS. 1a to 1c are flow sheets illustrating the multi-layer resist process.
Figure 1B:
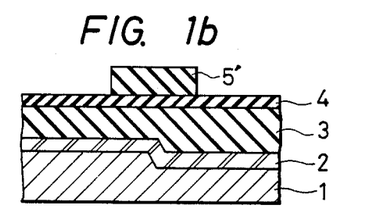
Figure 1C:
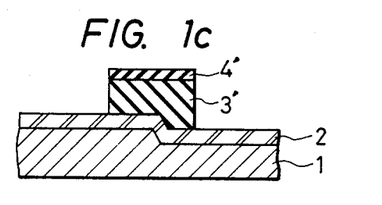

An Al film 2 to be processed was formed on an Si substrate 1 having topography as shown in FIG. 1a. 20 wt.%, based on the polymer, of 1-(p-azidobenzylidene)-3-(α-hydroxybenzyl)indene (bisazide I) as the aromatic azide compound was added to polyvinylphenol as the polymer as shown in column No. 1 of Table 1. The mixture was dissolved in cyclohexanone solvent and the obtained solution was applied to the Al film 2 by spinning to form a bottom organic substance layer 3 and flatten the surface. Thereafter, the coated substrate was baked at 180° C. for 20 min. In this stage, the percentage transmission of the bottom organic substance layer 3 for the light of a wavelength of 436 nm was 24% (as calculated with a film of a thickness of 1 μm) as shown in Table 1. Thus, the influence of reflected light from the substrate in the course of the exposure can be prevented substantially. Then, an intermediate SiO₂ film 4 was formed by the application of SOG followed by a thermal treatment. A positive photoresist was applied thereto to form a photoresist layer 5. Then, a desired resist pattern 5' was formed by a known photolithographic process as shown in FIG. 1b. In this step, the shape of the resist pattern 5' was kept well and it was recognized that the light was absorbed efficiently by the bottom organic substance layer 3. Then, exposed parts of the intermediate layer 4 were etched selectively with the resist pattern 5' used as a mask to form a mask pattern 4' comprising the intermediate layer as shown in FIG. 1c. Thereafter, the exposed parts of the bottom organic substance layer 3 were etched successively by an oxygen reactive ion etching process or sputter etching process to form a desired pattern. Thus, patterns 3' and 4' having an excellent shape and a high dimensional accuracy were formed as shown in FIG. 1c.

Since the intermediate layer 4 is used as the mask pattern in the step of dry etching of the bottom organic substance layer, the material for the intermediate layer 4 should have a higher dry etching resistance than that of said organic substance layer. By selecting a material having a dry etching resistance higher than that of the bottom organic substance layer in the formation of the resist film 5, the intermediate layer may be omitted and the resist pattern may be used as the mask pattern in the step of dry-etching the bottom organic substance layer. Materials for the intermediate layer which satisfy the above-mentioned conditions include, for example, SiO₂, phosphosilicate glass, polycrystalline silicon and SOG (spin-on glass).

Example 2

The same procedure as in Example 1 was repeated except that polystyrene, polyvinyl alcohol or novolak resin as shown in Table 1, Nos. 2 to 4 was used as the polymer in place of polyvinylphenol. They were combined with an aromatic bisazide compound I or II.

As a result, the percentage transmission of the light of a wavelength of 436 nm was lowered to 52, 45 and 11%, respectively, after the baking treatment while that of a comparative positive photoresist (OFPR-800; a product of Tokyo Ohka Kogyo Co.) was 70%.

TABLE 1

| No. | Polymer | Aromatic azide compound (Note 1) | Amount of azide (wt. %) | Solvent | Percentage transmission (%) after baking at 180° C. for 20 min (film thickness: 1 μm) 436 nm | 546 nm |
|---|---|---|---|---|---|---|
| Present invention | | | | | | |
| 1 | polyvinylphenol | I (bisazide) | 20 | cyclohexanone | 24 | 71 |
| 2 | polystyrene | I (bisazide) | 20 | cyclohexanone | 52 | 87 |
| 3 | polyvinyl alcohol | II (bisazide) | 20 | water | 45 | 84 |
| 4 | novolak resin | I (bisazide) | 20 | ethyl cellosolve acetate | 11 | 73 |
| 5 | polyvinyl phenol | III (monoazide) + IV (bisazide) | each 20 | cyclohexanone | 46 | 88 |
| 6 | photoresist | I (bisazide) | 20 | ethyl cellosolve acetate | 14 | 77 |
| 7 (Note 2) | photoresist | I (bisazide) | 20 | ethyl cellosolve acetate | 21 | 79 |
| Comp. Ex. | photoresist | not used | — | ethyl cellosolve | 70 | 94 |

TABLE 1-continued

| No. | Polymer | Aromatic azide compound (Note 1) | Amount of azide (wt. %) | Solvent | Percentage transmission (%) after baking at 180° C. for 20 min (film thickness: 1 μm) | |
|---|---|---|---|---|---|---|
| | | | | | 436 nm | 546 nm |
| | | | | acetate | | |

(Note 1)
I. 1-(p-azidobenzylidene)-3-(α-hydroxybenzyl)-indene

(absorption maximum wave length $\lambda_{max}$ = 357 nm, ethanol)
II. sodium 4,4'-diazidostilbene-2,2'-disulfonate ($\lambda_{max}$ = 340 nm, water)
III. 4-azidochalcone ($\lambda_{max}$ = 337 nm, ethanol)
IV. 3,3'-diazidodiphenyl sulfone ($\lambda_{max}$ = 240 nm, ethanol)
(Note 2)
the flood exposure treatment.
(Note 3)
photoresist: OFPR-800 (trade name of Tokyo Ohka Kogyo Co.).

Example 3

The same procedure as in Example 1 was repeated except that 20 wt.%, based on the polymer (polyvinylphenol), a mixture of monoazide III (4-azidochalcone) and bisazide IV (3,3'-diazidodiphenyl sulfone) as shown in the column No. 5 of Table 1 was used in place of the bisazide I as the bottom organic substance layer 3. A sufficient insolubilization in the solvent was attained after the baking treatment conducted at 180° C. for 20 min and the percentage transmission of the light of a wavelength of 436 nm was lowered to 46% favorably, while that obtained in the comparative example was 70%.

When the monoazide III was used alone, the insolubilization in the organic solvent was insufficient after the baking treatment conducted at 180° C. When the SOG layer (intermediate layer) and positive photoresist layer (top layer) were formed thereon, the bottom layer was dissolved to make the formation of the multi-layer resist structure impossible. When the bisazide IV was used alone, the absorption maximum wavelength was as short as 240 nm and the percentage transmission of the light of a wavelength of 436 nm was higher than that (70%) obtained in the comparative example, while the insolubilization in the organic solvent after the baking treatment was sufficient. Namely, it was difficult to obtain preferred results when the monoazide III or IV was used alone. In other words, the preferred results could not be obtained unless the mixture of them was used as shown in Example 3.

Example 4

The same procedure as in Example 1 was repeated except that a positive photoresist (OFPR-800) comprising a mixture of novolak resin and a naphthoquinone diazide derivative was used as shown in the column No. 6 of Table 1 in place of the polymer used in Example 1 in forming the bottom organic substance layer 3 and that 20 wt.% of the bisazide I was added thereto. As a result, the percentage transmission of the light of a wavelength of 436 nm could be reduced remarkably to 14%, while that obtained in the comparative example was 70%.

Example 5

The same procedure as in Example 4 was repeated except that the baking treatment conducted at 180° C. for 20 min was replaced with the flood exposure treatment conducted with a 500 W ultra-high pressure mercury lamp for 20 min and then the percentage transmission was determined. The percentage transmission of the light of a wavelength of 436 nm was 21% (as calculated with a film of a thickness of 1 $\mu$m). The bottom organic substance layer 3 was insoluble in an organic solvent after this treatment. It was thus proved that the preferred results could be obtained even when the flood exposure treatment was employed in place of the baking treatment.

Example 6

An Al film 2 to be processed was formed on an Si substrate 1 having a topography as shown in FIG. 1a 20 wt.%, based on the polymer, of 1-phenyl-3-methyl-4-(p-azidosulfophenylazo)-5-pyrazolone as the aromatic sulfonyl azide compound was added to polyvinylphenol as the polymer and then 20 wt.%, based on the polymer, of 3,3'-diazidodiphenyl sulfone as a heat crosslinking agent was added thereto. The obtained mixture was dissolved in cyclohexanone and applied to the Al film 2 by spinning to form a bottom organic substance layer 3 and to flatten the surface. Thereafter, the coated substrate was baked at 200° C. for 20 min. In this stage, the percentage transmission of the bottom organic substance layer 3 for the light of a wavelength of 436 nm was 0% (as calculated with a film of a thickness of 1 $\mu$m). Thus, the influence of reflected light from the substrate in the course of the exposure can be prevented completely. Then, an intermediate silicon compound (SOG) layer was formed thereon by a known process and further a positive photoresist was applied thereto to form a photoresist layer 5. Then, a desired resist pattern 5' was formed by an ordinary photolithographic process as shown in FIG. 1b. In this step, the shape of the resist pattern 5' was kept well and it was recognized that the light was absorbed efficiently in the bottom organic substance layer 3. Then, the intermediate layer 4 was etched selectively with the resist pattern 5' used as a mask to form a mask pattern 4' comprising the intermediate layer 4 as shown in FIG. 1c. Thereafter, the exposed parts of the bottom organic substance layer were etched successively by an oxygen reactive ion etching process or sputter etching process to form a desired pattern. Thus, the pattern having an excellent shape and a high dimensional accuracy could be formed as shown in FIG. 1c.

The percentage transmission of the bottom organic substance layer 3 in this example was 82% for the light of a wavelength of 546 nm used in the detection of an alignment mark before the baking treatment and it was 64% after the baking treatment conducted at 200° C. On the other hand, when 1-phenyl-3-methyl-4-(p-azidophenylazo)-5-pyrazolone having the same skeleton as that of said aromatic sulfonyl azido compound was used, the percentage transmission for the light of 546 nm was 90% before the baking treatment and it was reduced to 26% after the baking treatment conducted at 200° C.

Thus, it was confirmed that when the aromatic sulfonyl azide compound was added to the polymer, the reduction in the percentage transmission for the light used in the detection of an alignment mark due to the baking treatment can be controlled remarkably.

Example 7

The same procedure as in Example 6 was repeated except that the light absorbent used in Example 6 was replaced with 4-N,N-dimethylamino-4'-azidosulfoazobenzene. The percentage transmission for the light of a wavelength of 436 nm was 0 and 1% before and after the baking treatment, respectively and that for the light of a wavelength of 546 nm was 55% and 54%, respectively. Thus, it was confirmed that the percentage transmission was scarcely changed by the baked treatment. On the other hand, when 4-N,N-dimethylamino-4'-azidoazobenzene having the same skeletal structure as above but wherein the azido group was bonded directly to the benzene nucleus was used, the percentage transmission for the light of 546 nm was 89% before the baking treatment but it was remarkably reduced to 37% after the baking treatment conducted under the same conditions as above (200° C., 20 min), while the percentage transmission for the light of 436 nm was 0% before the baking treatment and it was scarcely changed after the same treatment (1%).

Thus, it was recognized that the spectral change of the aromatic sulfonyl azide compound due to the baking treatment was smaller than that of the aromatic azide compound. It was also found that the percentage transmission ratio of the light used in the exposure of the top photoresist layer in the multi-layer resist process on the light used in the detection of an alignment mark was high and, therefore, the accuracy of the alignment could be improved.

Example 8

Figure 2:
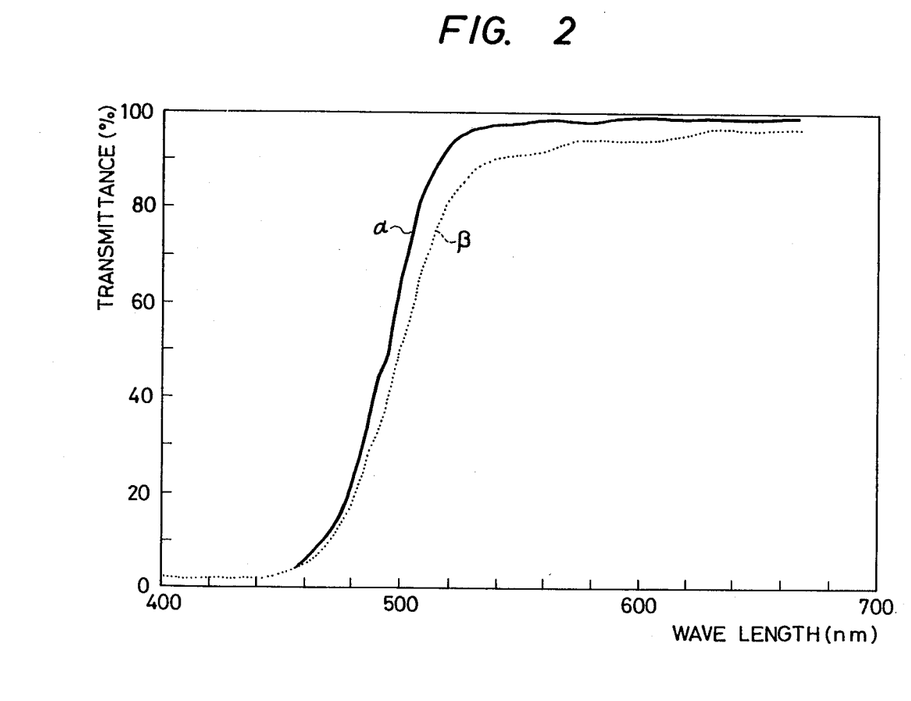
FIG. 2 is a graph showing effects of an embodiment of the present invention.

The same procedure as in Example 6 was repeated except that the light absorbent in the bottom organic substance layer 3 was replaced with one prepared by reacting Kayanol Yellow N5G (an acid dye of Nippon Kayaku Co., Ltd.) with thionyl chloride in dimethylformamide to form a sulfonic chloride and then treating the same with sodium azide to form a sulfonyl azide absorbent. In the infrared absorption spectrum, an absorption due to sulfonyl azide group was recognized at 2130 cm$^{-1}$. The percentage transmission for the light of 436 nm was 2% before and after the baking treatment conducted at 200° C. for 15 min and that for the light of 546 nm before and after the same treatment as above was 98% and 91%, respectively. The spectral change caused by the baking treatment of the absorbent in this example is shown in FIG. 2. In FIG. 2, a curve $\alpha$ and a broken line $\beta$ represent the spectrum before and after the baking treatment, respectively. Thus, a fine pattern having a quite high dimensional accuracy could be obtained by using the bottom organic substance layer having a high exposure light absorbance and high transmission for the light used in the detection of an alignment mark in the multi-layer resist process.

As described above in detail, when the aromatic sulfonyl azide compound and/or aromatic azide compound are(is) incorporated in the high-molecular organic compound constituting the bottom layer and then subjected to the baking treatment or the flood exposure treatment, the organic layer insoluble in the solvent and having a high exposing light absorbance and a high transmission for the light used in detecting an alignment mark is obtained. Therefore, the shape of the pattern and the dimension thereof are retained almost perfectly irrespective of a diffused reflection or the interference of light. As a result, an excellent pattern having a high dimensional accuracy and good shape can be obtained.

Examples of the aromatic azide compounds used in the present invention include 1-(p-azidobenzylidene)-3-(α-hydroxybenzyl)indene, sodium 4,4'-diazidostilbene-2,2'-disulfonate, 4-azidochalcone and 3,3'-diazidodiphenyl sulfone. They may be used either alone or in the form of a mixture of two or more of them.

Examples of the aromatic sulfonyl azide compounds include those shown in Table 2. They may be, too, used alone or in the form of a mixture of two or more of them.

Though only the cases of patterning of the Al film were described in the above examples, these examples by no means limit the present invention. For example, the process of the present invention is quite suitable for the fine processing of alloys such as Al alloys and metals such as W and Mo and their silicides as well as insulating films such as $SiO_2$ films and polycrystalline silicon films. The process of the present invention may be employed in the manufacture of devices other than semiconductor integrated circuit devices such as a magnetic bubble memory device.

TABLE 2

| No. | Aromatic sulfonyl azide compounds |
| --- | --- |
| 1 | 1-phenyl-3-methyl-4-(p-azidosulfophenylazo)-5-pyrazolone |
| 2 | 4-N,N—dimethylamino-4'-azidosulfoazobenzene |
| 3 | 4'-aminoazobenzene-4-sulfonyl azide |
| 4 | p-(2-hydroxy-1-naphthylazo)benzenesulfonyl azide |
| 5 | p-(4-hydroxy-1-naphthylazo)benzenesulfonyl azide |
| 6 | 2',4'-dihydroxyazobenzene-4-sulfonyl azide |
| 7 | 4'-(N—phenylaminoazobenzene)-4-sulfonyl azide |
| 8 | 4,4'-bis(1-phenyl-3-methyl-5-hydroxy-4-pyrazolylazo)biphenyl-2,2'-bissulfonyl azide |
| 9 | p-(3-methyl-4-phenylazo-5-hydroxypyrazolyl)-benzenesulfonyl azide |
| 10 | 3-methyl-4-(1-phenyl-3-methyl-5-hydroxy-4-pyrazolylazo)benzenesulfonyl aide |
| 11 | p-[3-methyl-4-(p-azidosulfophenylazo)-5-hydroxypyrazolyl]benzenesulfonyl azide |
| 12 | p-(2-amino-1-naphthylazo)benzenesulfonyl azide |
| 13 | p-[3-methyl-4-(2,5-dichlorophenylazo)-5-hydroxypyrazolyl]phenylsulfonyl azide |
| 14 | 4,4'-bis(p-hydroxyphenylazo)stilbene-2,2'-disulfonyl azide |
| 15 | 4,4'-bis(p-aminophenylazo)stilbene-2,2'-disulfonyl azide |
| 16 | 4,4'-bis(p-methoxyphenylazo)stilbene-2,2'-disulfonyl azide |
| 17 | 4,4'-bis(p-ethoxyphenylazo)stilbene-2,2'-disulfonyl azide |
| 18 | p-(2,4-dihydroxy-3-quinolylazo)phenylsulfonyl azide |
| 19 | 2-[p-(4-hydroxyphenylazo)phenyl]benzothiazole-7-sulfonyl azide |
| 20 | 2-[4-(N,N—dimethylamino)styryl]quinoline-4-sulfonyl azide |
| 21 | 2-[4-(N,N—dimethylamino)styryl]benzothiazole-6-sulfonyl azide |
| 22 | 2-[4-(N,N—dimethylamino)styryl]benzimidazole-6-sulfonyl azide |

What is claimed is:

1. A pattern forming process, for forming a pattern using a mask pattern, the mask pattern being formed by patternwise exposure of a precursor material layer to light of a predetermined wavelength and developing the exposed precursor material layer to form the mask pattern, the precursor material being sensitive to light of said predetermined wavelength, comprising the steps of forming a film, to be processed, on a substrate, the substrate having topography on its surface, the film to be processed having a film topography corresponding to the topography of the substrate; forming a bottom layer comprising a light and/or heat sensitive aromatic azide compound, and a phenolic resin, over the whole surface of said film to be processed, to provide a bottom layer having a flattened upper surface, the bottom layer thereby having said aromatic azide compound incorporated therein, the aromatic azide compound being selected such that, after heating the bottom layer or exposing the whole surface of the bottom layer to light, the bottom layer has a reduced transmission of said light of the predetermined wavelength while having only an extremely small increased absorption of light of a wavelength over 500 nm; heating the bottom layer or exposing the whole surface of the bottom layer to a light, such that the bottom layer, having the aromatic azide compound incorporated therein and having been heated or the whole surface thereof exposed to light, has a reduced transmission of said light of the predetermined wavelength while having only an extremely small increased absorption of a wavelength over 500 nm; forming said mask pattern over said bottom layer, the mask pattern having a dry etching resistance higher than that of the bottom layer, the mask pattern being formed by substeps including exposing the layer of the precursor material to a pattern of said light of the predetermined wavelength and developing the exposed precursor material layer to remove portions thereof, thereby forming the mask pattern and exposing part of the bottom layer; removing the exposed part of the bottom layer by dry etching process so as to expose part of the film to be processed; and removing the exposed part of said film to be processed, whereby said pattern is formed in said film.

2. A process according to claim 1 wherein the aromatic azide compound contained in the bottom layer is at least one member of the group consisting of 1-(p-azidobenzylidene)-3-(α-hydroxybenzyl)indene, sodium 4,4'-diazidostilbene-2,2'-disulfonate, 4-azidochalcone and 3,3'-diazidodiphenyl sulfone.

3. A process according to claim 1 wherein the aromatic azide compound is contained in the bottom layer together with an aromatic sulfonyl azide compound, the aromatic azide compound being an aromatic bisazide compound.

4. A process according to claim 3 wherein the bisazide compound is at least one member of the group consisting of 3,3'-diazidodiphenyl sulfone, 4,4'-diazidodiphenylmethane, 4,4'-diazidodiphenyl ether, 4'4'-diazidodiphenyl sulfide, 4,4'-diazidodiphenyl disulfide, 4,4'-diazidodiphenyl sulfone and 4,4'-diazidostilbene.

5. A process according to claim 1 wherein the precursor material layer comprises a resist film.

6. A process according to claim 1 wherein the bottom layer is heated, the heat treatment being conducted at a temperature of 100° to 300° C.

7. A process according to claim 1 wherein the bottom layer is subjected to the whole surface exposure treatment, with the surface of the bottom layer being exposed to a light of a wavelength of 200 to 500 nm.

8. A process according to claim 1 wherein the aromatic azide compound has a maximum light absorption at wavelengths of 330 to 430 nm.

9. A process according to claim 1 wherein the layer of the percursor material is exposed to the pattern of light through a mask, the mask being positioned relative to the precursor material layer through detection of an alignment mark, and wherein the aromatic azide compound is selected such that, after said heating or said exposing, the bottom layer has said reduced transmission while having only an extremely small increased absorption of light, of a wavelength over 500 nm, used as a source of light in said detection of the alignment mark.

10. A process according to claim 9 wherein the predetermined wavelength is 405 nm or 436 nm.

11. A pattern forming process, for forming a pattern using a mask, the mask being formed by exposure of a photoresist film selectively to light of a predetermined wavelength and developing the exposed photoresist film, the photoresist material of the photoresist film being sensitive to light of said predetermined wavelength, comprising the steps of forming a film, to be processed, on a substrate, the substrate having topography on its surface, the film to be processed having a film topography corresponding to the topography of the substrate; forming a bottom layer comprising a light and/or heat sensitive aromatic azide compound, and a phenolic resin, over the whole surface of said film to be processed, to provide a bottom layer having a flattened upper surface, the bottom layer thereby having the aromatic azide compound incorporated therein, the aromatic azide compound being selected such that, after heating the bottom layer or exposing the whole surface of the bottom layer to light, the bottom layer has a reduced transmission of said light of the predetermined wavelength while having only an extremely small increased absorption of light of a wavelength over 500 nm; heating the bottom layer or exposing the whole surface of the bottom layer to a light, such that the bottom layer, having the aromatic azide compound incorporated therein and having been heated or the whole surface thereof exposed to light, has a reduced transmission of said light of the predetermined wavelength while having only an extremely small increased absorption of light of a wavelength over 500 nm; forming an intermediate layer comprising a material having a dry etching resistance higher than that of the bottom layer on the whole surface of the bottom layer; forming said photoresist film on the whole surface of the intermediate layer; exposing desired parts of the photoresist film selectively to said light of the predetermined wavelength so as to modify the solubility of the exposed parts selectively; developing the photoresist film to selectively remove the parts of high solubility, so as to expose parts of the intermediate layer; removing the exposed parts of the intermediate layer, so as to expose parts of the bottom layer; removing the exposed parts of the bottom layer by dry etching, so as to expose parts of the film to be processed; and removing the exposed parts of the film to be processed, whereby said pattern is formed in said film.

12. A process according to claim 11 wherein the aromatic azide compound contained in the bottom layer is at least one member of the group consisting of 1-(p-azidobenzylidene)-3-(α-hydroxybenzyl)indene, sodium 4,4'-diazidostilbene-2,2'-disulfonate, 4-azidochalcone and 3,3'-diazidodiphenylene sulfone.

13. A process according to claim 11 wherein the aromatic azide compound is contained in the bottom layer together with an aromatic sulfonyl azide compound, the aromatic azide compound being an aromatic bisazide compound.

14. A process according to claim 13 wherein the bisazide compound is at least one member of the group consisting of 3,3'-diazidodiphenyl sulfone, 4,4'-diazidodiphenylmethane, 4,4'-diazidodiphenyl ether, 4,4'-diazidodiphenyl sulfide, 4,4'-diazidodiphenyl disulfide, 4,4'-diazidodiphenyl sulfone and 4,4'-diazidostilbene.

15. A process according to claim 11 wherein the bottom layer is heated, the heat treatment being conducted at a temperature of 100° to 300° C.

16. A process according to claim 11 wherein the bottom layer is subjected to the whole surface exposure treatment, the exposure treatment being conducted with a light of a wavelength of 200 to 500 nm.

17. A pattern forming process, for forming a pattern using a mask pattern, the mask pattern being formed by patternwise exposure of a precursor material layer to light of a predetermined wavelength and developing the exposed precursor material layer to form the mask pattern, the precursor material being sensitive to light of said predetermined wavelength, comprising the steps of forming a film, to be processed, on a substrate, the substrate having topography on its surface, the film to be processed having a film topography corresponding to the topography of the substrate; forming a bottom layer comprising a light and/or heat sensitive aromatic sulfonyl azide compound, and a phenolic resin, over the whole surface of said film to be processed, to provide a bottom layer having a flattened upper surface, the bottom layer thereby having said aromatic sulfonyl azide compound incorporated therein, the aromatic sulfonyl azide compound being selected such that, after heating the bottom layer or exposing the whole surface of the bottom layer to light, the bottom layer has a reduced transmission of said light of the predetermined wavelength while having only an extremely small increased absorption of light of a wavelength over 500 nm; heating the bottom layer or exposing the whole surface of the bottom layer to a light, such that the bottom layer, having the aromatic sulfonyl azide compound incorporated therein and having been heated or the whole surface thereof exposed to light, has a reduced transmission of said light of the predetermined wavelength while having only an extremely small increased absorption of light of a wavelength over 500 nm; forming said mask pattern over said bottom layer, the mask pattern having a dry etching resistance higher than that of the bottom layer, the mask pattern being formed by substeps including exposing the layer of the precursor material to a pattern of said light of the predetermined wavelength and developing the exposed precursor material layer to remove portions thereof, thereby forming the mask pattern and exposing part of the bottom layer; removing the exposed part of the bottom layer by dry etching process so as to expose part of the film to be processed; and removing the exposed part of said film to be processed, whereby said pattern is formed in said film.

18. A process according to claim 17 wherein the aromatic sulfonyl azide compound contained in the bottom layer is at least one member of the group consisting of 1-phenyl-3-methyl-4-(p-azidosulfophenylazo)-5-pyrazolone, 4-N,N-dimethylamino-4'-azidosulfoazobenzene, 4'-aminoazobenzene-4-sulfonyl azide, p-(2-hydroxy-1-naphthylazo)benzenesulfonyl azide, p-(4-hydroxy-1-naphthylazo)benzenesulfonyl azide, 2',4'-dihydroxyazobenzene-4-sulfonyl azide, 4'-(N-phenylaminoazobenzene)-4-sulfonyl azide, 4,4'-bis(1-phenyl-3-methyl-5-hydroxy-4-pyrazolylazo)biphenyl- 2,2'-bissulfonyl azide, p-(3-methyl-4-phenylazo-5-hydroxypyrazolyl)benzenesulfonyl azide, 3-methyl-4-(1-phenyl-3-methyl-5-hydroxy-4-pyrazolylazo)benzenesulfonyl azide, p-[3-methyl-4-(p-azidosulfophenylazo)-5-hydroxypyrazolyl]benzenesulfonyl azide, p-(2-amino-1-naphthylazo)benzenesulfonyl azide, p-[3-methyl-4-(2,5-dichlorophenylazo)-5-hydroxypyrazolyl]phenylsulfonyl azide, 4,4'-bis(p-hydroxyphenylazo)stilbene-2,2'-disulfonyl azide, 4,4'-bis(p-aminophenylazo)stilbene-2,2'-disulfonyl azide, 4,4'-bis(p-methoxyphenylazo)stilbene-2,2'-disulfonyl azide, 4,4'-bis(p-ethoxyphenylazo)stilbene-2,2'-disulfonyl azide, p-(2,4-dihydroxy-3-quinolylazo)phenylsulfonyl azide, 2-[p-(4-hydroxyphenylazo)phenyl]benzothiazole-7-sulfonyl azide, 2-[4-(N,N-dimethylamino)styryl]quinoline-4-sulfonyl azide, 2-[4-(N,N-dimethylamino)styryl]benzothiazole-6-sulfonyl azide and 2-[4-(N,N-dimethylamino)styryl]benzimidazole-6-sulfonyl azide.

19. A process according to claim 17 wherein the precursor material layer comprises a resist film.

20. A process according to claim 17 wherein the bottom layer is heated, the heat treatment being conducted at a temperature of 100° to 300° C.

21. A process according to claim 17 wherein the bottom layer is subjected to the whole surface exposure treatment, with the surface of the bottom layer being exposed to a light of a wavelength of 200 to 500 nm.

22. A process according to claim 17 wherein the layer of the precursor material is exposed to the pattern of light through a mask, the mask being positioned relative to the precursor material layer through detection of an alignment mark, and wherein the aromatic sulfonyl azide compound is selected such that, after said heating or said exposing, the bottom layer has said reduced transmission while having only an extremely small increased absorption of light, of a wavelength over 500 nm, used as a source of light in said detection of the alignment mark.

23. A process according to claim 22 wherein the predetermined wavelength is 405 nm or 436 nm.

24. A pattern forming process, for forming a pattern using a mask, the mask being formed by exposure of a photoresist film selectively to light of a predetermined wavelength and developing the exposed photoresist film, the photoresist material of the photoresist film being sensitive to light of said predetermined wavelength, comprising the steps of forming a film, to be processed, on a substrate, the substrate having topography on its surface, the film to be processed having a film topography corresponding to the topography of the substrate; forming a bottom layer comprising a light and/or heat sensitive aromatic sulfonyl azide compound, and a phenolic resin, over the whole surface of said film to be processed, to provide a bottom layer having a flattened upper surface, the bottom layer thereby having the aromatic sulfonyl azide compound incorporated therein, the aromatic sulfonyl azide compound being selected such that, after heating the bottom layer or exposing the whole surface of the bottom layer to light, the bottom layer has a reduced transmission of said light of the predetermined wavelength while having only an extremely small increased absorption of light of a wavelength over 500 nm; heating the bottom layer or exposing the whole surface of the bottom layer to a light, such that the bottom layer, having the aromatic sulfonyl azide compound incorporated therein and having been heated or the whole surface thereof exposed to light, has a reduced transmission of said light of the predetermined wavelength while having only an extremely small increased absorption of light of a wavelength over 500 nm; forming an intermediate layer comprising a material having a dry etching resistance higher than that of the bottom layer on the whole surface of the bottom layer; forming said photoresist film on the whole surface of the intermediate layer; exposing desired parts of the photoresist film selectively to said light of the predetermined wavelength so as to modify the solubility of the exposed parts selectively; developing the photoresist film to selectively remove the parts of high solubility, so as to expose parts of the intermediate layer; removing the exposed parts of the intermediate layer, so as to expose parts of the bottom layer; removing the exposed parts of the bottom layer by dry etching, so as to expose parts of the film to be processed; and removing the exposed parts of the film to be processed, whereby said pattern is formed in said film.

25. A process according to claim 24 wherein the aromatic sulfonyl azide compound contained in the bottom layer is at least one member of the group consisting of 1-phenyl-3-methyl-4-(p-azido sulfophenylazo)-5-pyrazolone, 4-N,N-dimethylamino-4'-azidosulfoazobenzene, 4'-aminoazobenzene-4-sulfonyl azide, p-(2-hydroxy-1-naphthylazo)benzenesulfonyl azide, p-(4-hydroxy-1-naphthylazo)benzenesulfonyl azide, 2',4'-dihydroxy-azobenzene-4-sulfonyl azide, 4'-(N-phenylaminoazobenzene)-4-sulfonyl azide, 4'4'-bis(1-phenyl-3-methyl-5-hydroxy-4-pyrazolylazo)biphenyl-2,2'-bissulfonyl azide, p-(3-methyl-4-phenylazo-5-hydroxypyrazolyl)benzensulfonyl azide, 3-methyl-4-(1-phenyl-3-methyl-5-hydroxy-4-pyrazolylazo)benzenesulfonyl azide, p-[3-methyl-4-(p-azidosulfophenylazo)-5-hydroxypyrazolyl]benzenesulfonyl azide, p-(2-amino-1-naphthylazo)benzenesulfonyl azide, p-[3-methyl-4-(2,5-dichlorophenylazo)-5-hydroxypyrazolyl]phenylsulfonyl azide, 4,4'-bis(p-hydroxyphenylazo)stilbene-2,2'-disulfonyl azide, 4,4'-bis(p-aminophenylazo)stilbene-2,2'-disulfonyl azide, 4,4'-bis(p-methoxyphenylazo)stilbene-2,2'-disulfonyl azide, 4,4'-bis(p-ethoxyphenylazo)stilbene-2,2'-disulfonyl azide, p-(2,4-dihydroxy-3-quinolylazo)phenylsulfonyl azide, 2-[p-(4-hydroxyphenylazo)phenyl]benzothiazole-7-sulfonyl azide, 2-[4-(N,N-dimethylamino)styryl]quinoline-4-sulfonyl azide, 2-[4-(N,N-dimethylamino)styryl]benzothiazole-6-sulfonyl azide and 2-[4-(N,N-dimethylamino)styryl]benzimidazole-6-sulfonyl azide.

26. A process according to claim 24 wherein the bottom layer is heated, the heat treatment being conducted at a temperature of 100° to 300° C.

27. A process according to claim 24 wherein the bottom layer is subjected to the whole surface exposure treatment, the exposure treatment being conducted with a light of a wavelength of 200 to 500 nm.

28. A process according to claim 24 wherein the photoresist film is exposed to the pattern of light through a mask, the mask being positioned relative to the photoresist film through detection of an alignment mark, and wherein the aromatic sulfonyl azide compound is selected such that, after said heating or said exposing, the bottom layer has said reduced transmission while having only an extremely small increased absorption of light, of a wavelength over 500 nm, used as a source of light in said detection of the alignment mark.

29. A process according to claim 28 wherein the predetermined wavelength is 405 nm or 436 nm.

30. A process according to claim 11 wherein the photoresist film is exposed to the pattern of light through a mask, the mask being positioned relative to the photoresist film through detection of an alignment mark, and wherein the aromatic azide compound is selected such that, after said heating or said exposing, the bottom layer has said reduced transmission while having only an extremely small increased absorption of light, of a wavelength over 500 nm, used as a source of light in said detection of the alignment mark.

31. A process according to claim 30 wherein the predetermined wavelength is 405 nm or 436 nm.

32. A pattern forming process, for forming a pattern using a mask pattern, the mask pattern being formed by patternwise exposure of a precursor material layer to light of a predetermined wavelength and developing the exposed precursor material layer to form the mask pattern, the precursor material being sensitive to light of said predetermined wavelength, comprising the steps of forming a film, to be processed, on a substrate, the substrate having topography on its surface, the film to be processed having a film topography corresponding to the topography of the substrate; forming a bottom layer comprising a light and/or heat sensitive aromatic azide compound, and a phenolic resin, over the whole surface of said film to be processed, to provide a bottom layer having a flattened upper surface, the bottom layer thereby having said aromatic azide compound incorporated therein, the aromatic azide compound being selected such that, after heating the bottom layer or exposing the whole surface of the bottom layer to light, the bottom layer has a reduced transmission of said light of the predetermined wavelength while permitting transmission of light of a wavelength of over 500 nm; heating the bottom layer or exposing the whole surface of the bottom layer to a light, such that the bottom layer, having the aromatic azide compound incorporated therein and having been heated or the whole surface thereof exposed to light, has a reduced transmission of said light of the predetermined wavelength while permitting transmission of light of a wavelength over 500 nm; forming said mask pattern over said bottom layer, the mask pattern having a dry etching resistance higher than that of the bottom layer, the mask pattern being formed by substeps including exposing the layer of the precursor material to a pattern of said light of the predetermined wavelength and developing the exposed precursor material layer to remove portions thereof, thereby forming the mask pattern and exposing part of the bottom layer; removing the exposed part of the bottom layer by dry etching process so as to expose part of the film to be processed; and removing the exposed part of said film to be processed, whereby said pattern is formed in said film.

33. A process according to claim 32 wherein the layer of the precursor material is exposed to the pattern of light through a mask, the mask being positioned relative to the precursor material layer through detection of an alignment mark by irradiating light of a wavelength of over 500 nm thereon, the aromatic azide compound being selected such that, after said heating or said exposing, the bottom layer has said reduced transmission while permitting sufficient transmission of the light of the wavelength of over 500 nm so as to be able to detect the alignment mark during the detection thereof.

34. A process according to claim 17 wherein the aromatic sulfonyl azide compound is an aromatic bisulfonyl azide compound.

* * * * *